(12) United States Patent
Krispin

(10) Patent No.: US 6,769,724 B2
(45) Date of Patent: Aug. 3, 2004

(54) MULTI-PART HOUSING AND DEVICE FOR LOCKING INTERCONNECTED HOUSING PARTS OF A MULTI-PART HOUSING

(75) Inventor: Harro Krispin, Berlin (DE)

(73) Assignee: DeTeWe-Deutsche Telephonwerke Aktiengesellschaft & Co., Berlin (DE)

( * ) Notice: Subject to any disclaimer, the term of this patent is extended or adjusted under 35 U.S.C. 154(b) by 0 days.

(21) Appl. No.: 10/006,432

(22) Filed: Dec. 7, 2001

(65) Prior Publication Data

US 2002/0071243 A1 Jun. 13, 2002

(30) Foreign Application Priority Data

Dec. 7, 2000 (DE) .................................. 200 20 983 U

(51) Int. Cl.⁷ .............................................. E05C 1/04
(52) U.S. Cl. ...................................... 292/153; 292/147
(58) Field of Search ................................ 292/218, 153, 292/176, 147; 411/41, 44, 45, 108, 349, 551–553; 361/726

(56) References Cited

U.S. PATENT DOCUMENTS

| | | | | |
|---|---|---|---|---|
| 3,371,511 A | * | 3/1968 | Atkinson | 70/71 |
| 3,836,704 A | * | 9/1974 | Coules | 174/138 D |
| 4,007,516 A | * | 2/1977 | Coules | 24/221 R |
| 5,368,427 A | * | 11/1994 | Pfaffinger | 411/553 |
| 5,690,460 A | * | 11/1997 | Attansio | 411/551 |
| 5,695,296 A | * | 12/1997 | Miura | 403/2 |
| 5,751,545 A | * | 5/1998 | Jung | 361/683 |
| 5,754,412 A | * | 5/1998 | Clavin | 361/804 |
| 5,763,830 A | * | 6/1998 | HsuCh | 174/60 |
| 5,878,608 A | * | 3/1999 | Alyanakian | 70/208 |
| 5,897,147 A | * | 4/1999 | Alyanakian | 292/175 |
| 5,934,115 A | * | 8/1999 | Bernier | 70/208 |
| 6,279,754 B1 | * | 8/2001 | Hoss | 211/26 |

FOREIGN PATENT DOCUMENTS

DE            92 03 115.3            6/1992

* cited by examiner

Primary Examiner—Gary Estremsky
(74) Attorney, Agent, or Firm—Laurence A. Greenberg; Werner H. Stemer; Gregory L. Mayback

(57) ABSTRACT

A device for locking a first housing part and a second housing part to one another includes a locking element inserted into an opening in the first housing part. The locking element is configured to be movable between a locking position and an unlocking position. The locking element, if in the locking position, connects the first housing part to the second housing part in a form-locking and/or a force-locking manner. The locking element, if in the unlocking position, releases a connection between the first housing part and the second housing part. A blocking element is connected to the locking element for blocking the locking element from being adjusted at least in the locking position. A multi-part housing is also provided.

22 Claims, 5 Drawing Sheets

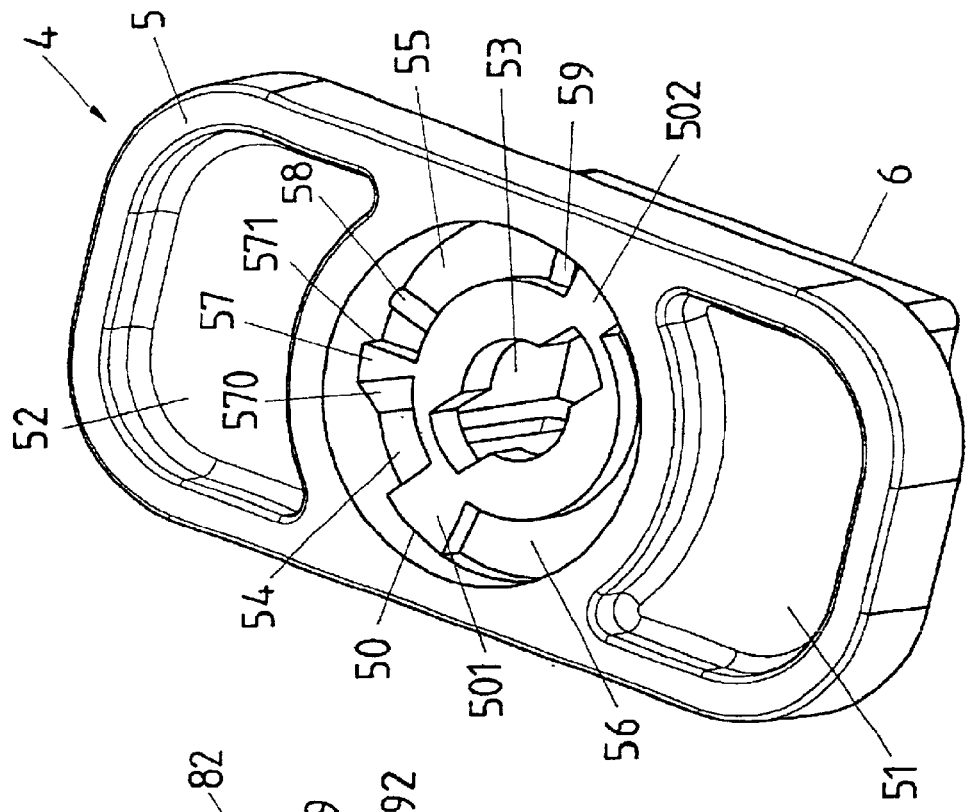
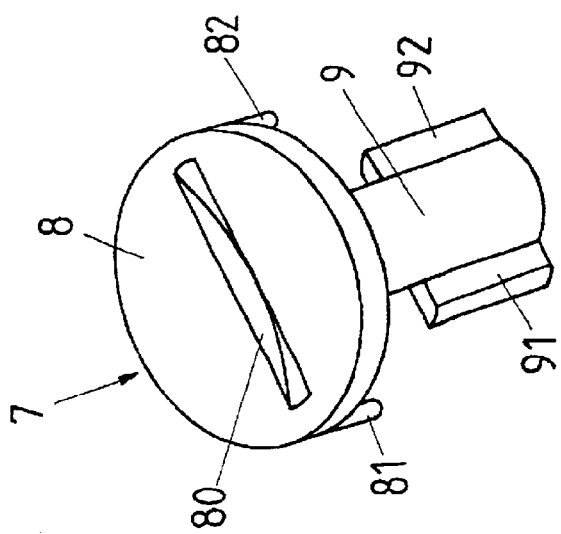

MULTI-PART HOUSING AND DEVICE FOR LOCKING INTERCONNECTED HOUSING PARTS OF A MULTI-PART HOUSING

BACKGROUND OF THE INVENTION

Field of the Invention

The invention relates to a device for locking interconnected housing parts of a multi-part housing for electric and electronic components and to a multi-part housing.

Housings for electric and electronic components, in particular housings for telecommunications systems, serve for protecting the electric and electronic components against damage and contamination and also against unauthorized intervention, which may destroy or functionally impair the electric or electronic components or even the entire system.

German Utility Model No. DE 92 03 115 U1 discloses a housing for a telecommunications system in the form of a private branch exchange and includes a bottom housing part for accommodating the electronic components and terminals as well as a covering shroud which is secured against unauthorized opening. In order to avoid the situation where the covering shroud can only be opened by a special tool, the covering shroud, on one longitudinal side, has latching elements which interact with complementary latching elements of the bottom part and lock the covering shroud, once placed in position, on one longitudinal side.

On the opposite longitudinal side, the bottom part has a resilient blocking hook which is oriented in the direction of the inside of the associated covering-shroud side wall and, once the covering shroud has been pushed on, penetrates into an inner recess of the side wall and locks the covering shroud. The blocking hook also has a lug provided with an opening, while the bottom part, in the region of the lug, has an opening which allows a tool to be introduced into the opening of the lug, with the result that the blocking hook can be levered out of the recess and releases the covering shroud.

The known device for connecting and locking a covering shroud to a bottom housing part is a configuration that requires a high outlay and requires comparatively laborious handling for unlocking the covering shroud, using a tool which is necessary for this purpose. In addition, the known locking device is only suitable for respectively intended housing sizes and shapes, since precise coordination is necessary between the blocking hook and the opening in the bottom housing part.

SUMMARY OF THE INVENTION

It is accordingly an object of the invention to provide a device for locking housing parts that are connected to one another which overcomes the above-mentioned disadvantages of the heretofore-known devices of this general type and which is easy to produce and install, and which is suitable for universal use for different housing sizes and shapes, and the locking of which can be blocked easily and reliably and without the use of special tools.

With the foregoing and other objects in view there is provided, in accordance with the invention, in combination with a multi-part housing configured to accommodate electric components and electronic components, the multi-part housing having a first housing part and at least a second housing part, the first housing part having an opening formed therein and being connectable to the second housing part, a device for locking the first housing part and the second housing part to one another, including:

a locking element inserted into the opening of the first housing part, the locking element being configured to be movable between a locking position and an unlocking position;

the locking element, if in the locking position, connecting the first housing part to the second housing part in a form-locking and/or a force-locking manner;

the locking element, if in the unlocking position, releasing a connection between the first housing part and the second housing part; and a blocking element connected to the locking element, the blocking element blocking the locking element from being adjusted at least in the locking position.

In other words, a device for locking interconnected housing parts of a multi-part housing for electric and electronic components, having a locking element which is inserted into an opening of a first housing part and, in a locking position, connects the first housing part to at least a second housing part in a form-fitting and/or force-fitting manner and, in an unlocking position, releases the connection between the first and second housing parts, wherein the locking element is connected to a blocking element, which blocks the adjustability of the locking element at least in the locking position.

The solution according to the invention is easy to produce and install since it is not necessary to keep to specific tolerances and the locking and blocking functions are separated from one another. On account of its straightforward mechanism, the locking and blocking device according to the invention can be used universally for different housing sizes and shapes, and the locking can be blocked easily and reliably without special tools being required, since separating the locking and blocking functions makes it possible for the locking device to be blocked only in certain positions, in which the housing parts either are fully locked or, for separation of the housing parts, are fully unlocked. Likewise on account of the functions being separated, it is possible for the blocking device to be configured such that it can be operated without special tools, although the blocking function cannot be eliminated by unintended handling.

The locking element is preferably inserted into a slot-like opening of the first housing part in a form-locking manner, such that it can be displaced in the longitudinal direction, while the blocking element brings parts of the locking element into force-locking abutment against sections of the lateral borders of the opening of the first housing part, the borders running essentially parallel to one another in the displacement direction of the locking element.

A device for blocking the possible displacement of the locking element at least in a force-locking manner allows the locking element to be blocked in each position on its displacement path within the opening of the first housing part and ensures a straightforward configuration of the blocking element for performing the blocking function.

The locking element preferably has an actuating surface, which butts against the outer wall of the first housing part, and a sliding and arresting body, which engages through the opening of the first housing part and is configured, in particular, as a hollow body with sliding elements which butt against the lateral borders of the opening in the first housing part and are part of wall sections of the sliding and arresting body which run parallel to the lateral borders of the opening of the first housing part.

This configuration of the locking element allows a straightforward configuration and connection of the locking element to the relevant housing part and provides for straightforward and space-saving accommodation of the blocking element.

For this purpose, the wall sections of the sliding and arresting body can be moved perpendicularly to the displacement direction, while, in the locking position, the blocking element, inserted into the locking element, brings the sliding elements of the movable wall sections into force-locking abutment against the lateral opening borders.

In order to enhance the blocking action and to ensure that the blocking function can only be activated in defined positions of the locking element, in particular in the locking and unlocking positions, the movable wall sections of the sliding and arresting body are provided with latching protrusions such that, when the sliding and arresting body is plugged into the opening of the first housing part, the movable wall sections slide along the lateral opening borders and, once the latching protrusions have been overcome, the locking element is connected to the first housing part in a form-locking manner and the sliding elements butt against the lateral opening borders, with the result that the sliding elements, configured as sliding webs, in predetermined positions of the locking element, latch in notches of the lateral borders of the opening in the first housing part.

It is preferable for the sliding webs to be provided in the center of the locking element, and for the notches to be provided in the lateral opening borders, such that, in the locking and unlocking positions of the locking element, the sliding webs latch into the notches.

In order to allow straightforward operation of the blocking element and, at the same time, to rule out unintended and unauthorized opening of the housing, or to make it more difficult, there is provided in the actuating surface of the locking element an adjusting part, which belongs to the locking element, configured as a rotary locking device, and a rotary pin of the blocking element, the pin projecting perpendicularly from the actuating surface of the locking element, is provided with lateral clamping webs which, by rotation of the adjusting part, can be brought into abutment against the movable wall sections of the sliding and arresting body.

In order to rule out incorrect operation of the blocking element by the latter being actuated in non-defined positions, the adjusting part of the rotary locking device can only be brought into the locking position of the locking device when the sliding webs have been latched into one of the notches of the lateral borders in the housing opening.

In order to provide a pleasing appearance, and to avoid a locking device which projects from the housing wall, the actuating surface of the locking element is inserted into a depression of those wall sections of the first housing part which are adjacent to the opening.

The same purpose is served by a depression which is located in the actuating surface of the locking element and is intended for accommodating the adjustment part of the blocking element, the adjusting part being configured in the form of a circular disk and being provided with a centrally provided actuating slot or web.

In order to ensure easy installation of the locking and blocking elements, and to assign the locking element and the blocking element to one another in a defined manner, the actuating surface of the locking element has a keyhole opening for accommodating the rotary pin and the clamping webs of the blocking element, the keyhole opening being aligned diagonally in relation to the movable wall sections of the locking element.

For straightforward installation of the locking and blocking elements, use is made of a configuration of the blocking element which does not require prior alignment of the blocking element in relation to the locking element in order to connect the two parts to one another. For this purpose, the underside of the adjusting part has at least one nose which is aligned with the clamping webs, which project from the rotary pin on opposite sides to one another, and, in order to accommodate the adjusting part, the depression of the actuating surface contains a groove which is in the form of part of a circle and in which the nose on the underside of the adjusting part engages.

Also provided in the part-circle groove is a web which subdivides the part-circle groove into an insertion region, which is essentially aligned with the keyhole opening and is intended for the nose, and an adjusting region for the blocking element, the web having an oblique surface, which is directed toward the insertion region, and a vertical surface, which is directed toward the adjusting region, such that, once the blocking element has been inserted into the locking element and the web has been overcome, the blocking element can be adjusted by the angular extent of the adjusting region between the locking and the unlocking positions.

This configuration of the accommodating surface of the locking element in conjunction with the configuration of the blocking element makes it possible for the blocking element to be inserted in any desired alignment into the locking element, the keyhole opening of the locking element, in conjunction with the clamping webs of the blocking element, predetermining the insertion direction, although the alignment of the blocking element is arbitrary.

Since, according to a further feature of the invention, the clamping webs of the adjusting part are spaced apart from the underside of the adjusting part at least by the extent of the depth of the keyhole opening of the actuating surface, it is the case that, following slight rotation of the blocking element, by virtue of the web being overcome, the blocking element is brought into a ready-to-function position and is connected reliably to the locking element.

In order for it to be possible to feel when the locking and the unlocking positions have been reached, the two end positions are defined by rounded protrusions within the adjusting region.

The second nose on the underside of the adjusting part of the blocking element, the nose not engaging in the adjusting region, is provided in a freely movable manner in an idling region in the actuating surface of the locking element, and thus has no function, without obstructing the action of the blocking element.

Finally, in order to facilitate the displacement of the locking element, finger hollows which are adjacent to the depression for accommodating the adjusting part of the blocking element are provided in the actuating surface of the locking element.

According to another feature of the invention, the depression in the actuating surface has a further groove formed therein, the further groove is configured as a continuous, part-circular groove for accommodating the second nose disposed diametrically opposite from the first nose, and the locking element has separating webs for separating the groove from the further groove.

According to yet another feature of the invention, the actuating surface of the locking element has finger hollows formed therein, the finger hollows are disposed adjacent to the depression accommodating the adjusting part of the blocking element.

With the objects of the invention in view there is also provided, a multi-part housing configuration, including:

a first housing part and at least a second housing part, the first housing part having an opening formed therein and being connectable to the second housing part;

a locking element inserted into the opening of the first housing part, the locking element being configured to be movable between a locking position and an unlocking position;

the locking element, if in the locking position, connecting the first housing part to the second housing part in at least one of a form-locking and a force-locking manner;

the locking element, if in the unlocking position, releasing a connection between the first housing part and the second housing part; and a blocking element connected to the locking element, the blocking element blocking the locking element from being adjusted at least in the locking position.

Other features which are considered as characteristic for the invention are set forth in the appended claims.

Although the invention is illustrated and described herein as embodied in a device for locking interconnected housing parts of a multipart housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5A is a perspective view of a blocking element according to the invention;

FIG. 5B is a perspective view of a locking element according to the invention;

DESCRIPTION OF THE PREFERRED EMBODIMENTS

Figure 1:
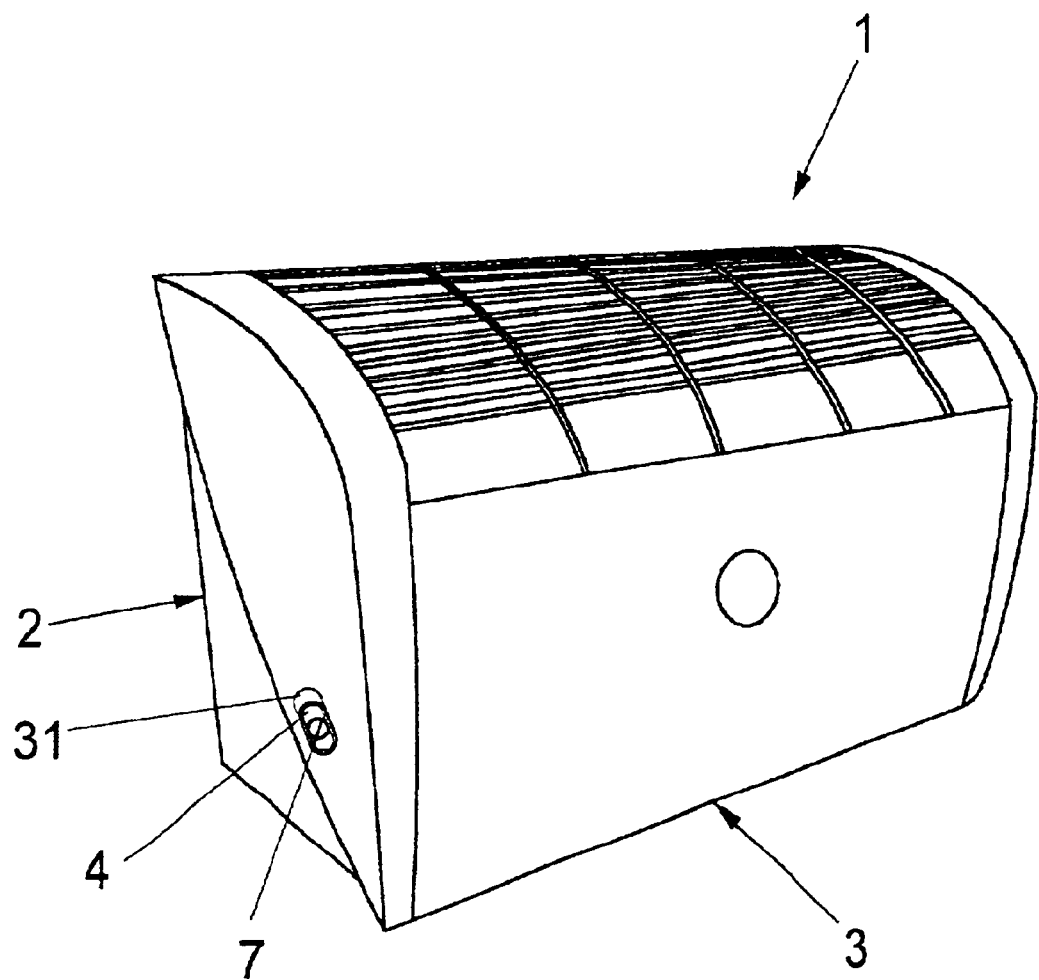
FIG. 1 is a perspective view of a modular-construction housing according to the invention for a telecommunications system.

Referring now to the figures of the drawings in detail and first, particularly, to FIG. 1 thereof, there is shown a perspective view of a housing 1 for a telecommunications system for accommodating and covering electric and electronic components 202 which connect lines and terminals. The housing 1 includes a housing base or bottom housing part 2, which has appropriate openings or protrusions for an optional wall fastening of the housing 1. The housing base 2 may be connected to a module frame, for example a 19-inch or ETSI (European Telecommunications Standards Institute) module frame, for accommodating the electric and electronic components, in particular for accommodating plug-in cards with electronic components provided thereon, plug-in sockets and a retaining device for a power supply.

In order to cover the subrack or module frame, connected to the housing base 2, and the plug connectors, electric and electronic components and the power-supply configuration, use is made of a covering shroud 3 which is positioned on the housing base 2, preferably in a form-locking manner, and is connected to the housing base 2. In order to lock the connection between the housing base 2 and the covering shroud 3, use is made of a locking element 4, which can be inserted into an opening of the covering shroud 3 and is connected to a blocking element 7 for blocking the position of the locking element 4, preferably in the locking or unlocking position, between the covering shroud 3 and the housing base 2.

The locking and blocking elements 4, 7 may optionally be fitted on one side wall of the covering shroud 3 or on both side walls and/or also on the front side or the underside or top side of the housing 1 if the housing base 2 has a corresponding possible connecting device into which the correspondingly provided locking element 4 can engage in a form-locking and/or force-locking manner. A form-locking or form-fitting connection is one which connects two elements together due to the shape of the elements themselves, as opposed to a force-locking connection, which locks the elements together by force external to the elements.

Figure 2:
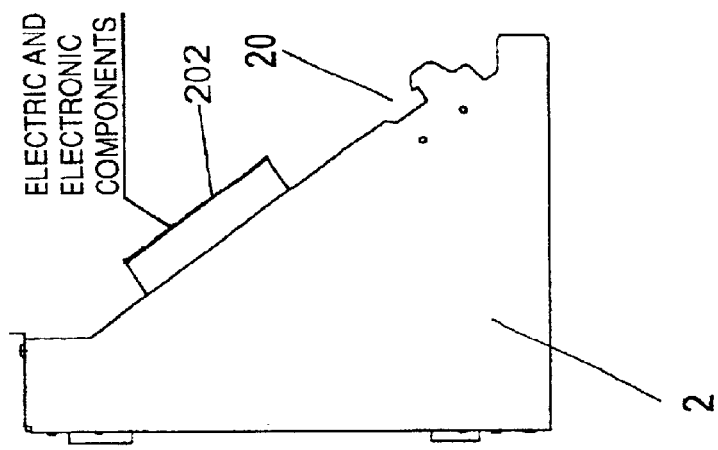
FIG. 2 is a side view of the bottom housing part.
Figure 7:
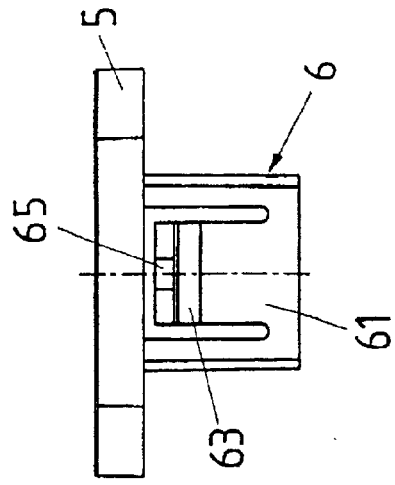
FIGS. 7 to 10 are plan views of the locking element according to the invention.
Figure 10:
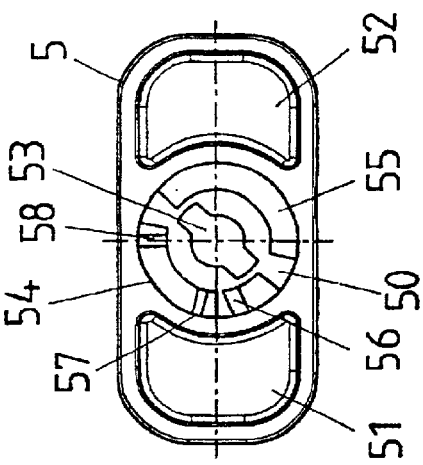
Figure 9:
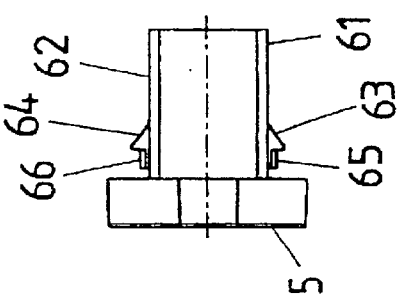
Figure 6:
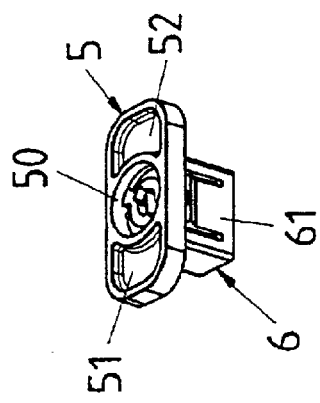
FIG. 6 is a perspective view of the locking element according to the invention.
Figure 8:
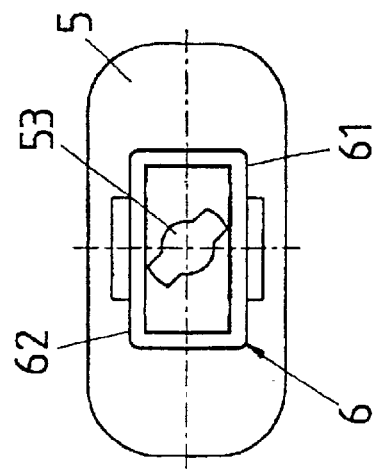
Figure 11:
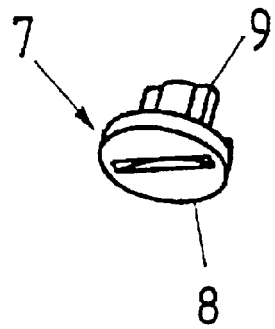
FIG. 11 is a perspective view of the blocking element according to the invention.
Figure 12:
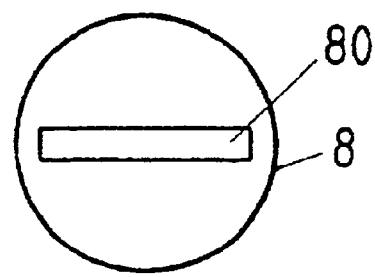
FIGS. 12 to 14 are plan views of the blocking element shown in FIG. 11.
Figure 13:
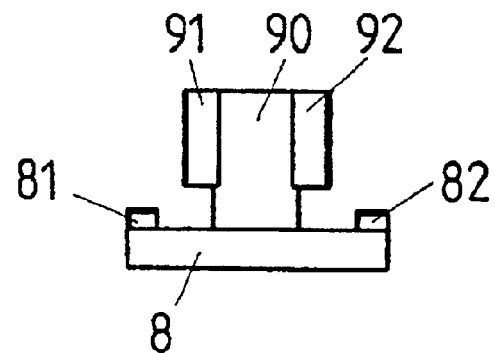
Figure 14:
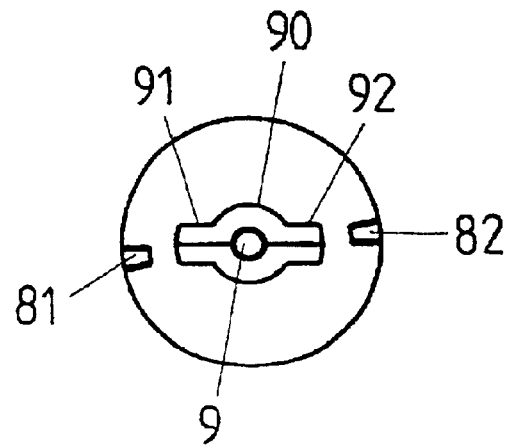

In the exemplary embodiment illustrated here, in order to arrest the covering shroud 3 and connect it to the housing base 2, a connecting element 4 is provided on both sides of the covering shroud 3, the connecting element, in the locked state of the covering shroud 3 and housing base 2, in the case of a side part of the housing base 2 configured according to FIG. 2, engaging behind an undercut 20 of the side part. For unlocking purposes, the locking element 4 is moved out of the undercut 20, with the result that the covering shroud 3 can be removed from the housing base 2.

The locking element 4 is provided in a depression 31 which is in the form of a hollow in the side part of the covering shroud 3 and encloses an opening 30 through which corresponding locking parts of the locking element 4 are plugged, the elements, in order to lock the covering shroud 3 and housing base 2, coming into engagement with the undercut 20 of the side part of the housing base 2.

Figure 4:
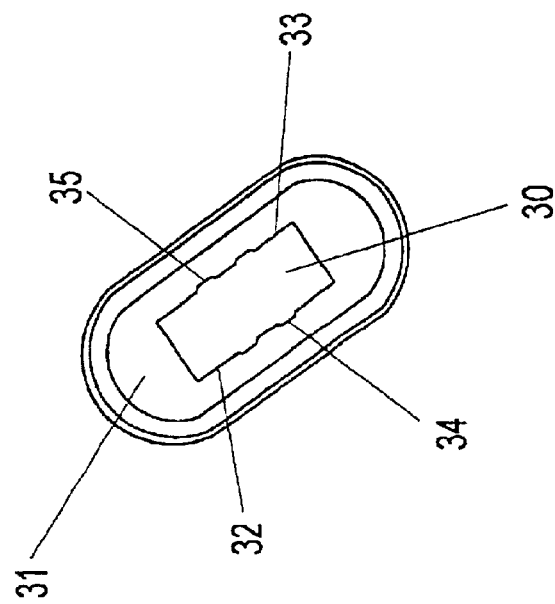
FIG. 4 is a plan view of the covering-shroud opening for accommodating the locking and blocking elements according to the invention.
Figure 3:
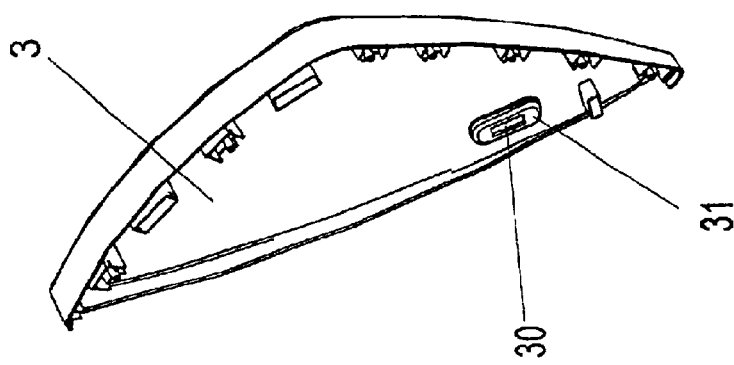
FIG. 3 is a perspective view of the inner side of a side part of the covering shroud.

FIG. 4 is a detailed view of that region of the side wall of the covering shroud 3 which serves for accommodating the locking element 4 and blocking element 7. The opening 30, which is provided in the hollow or depression 31, has two parallel lateral opening borders 32, 33 which, by way of end borders which are not designated specifically, form the opening 30. Provided in the lateral borders 32, 33 of the opening 30, located opposite one another, are in each case two notches 34, 35 which—as is illustrated hereinbelow—serve, in conjunction with a sliding web of the locking element 4, for the latching in of the locking element 4 in predetermined positions along the displacement path of the locking element 4 in order to define the locking and unlocking positions.

The depression or hollow 31, in conjunction with the corresponding shaping of an actuating surface of the locking element 4, makes it possible for the locking and blocking devices to terminate flush with the outer wall of the covering shroud 3, with the result that there are no projecting parts spoiling the overall appearance and unintended damage to the locking and blocking devices is avoided.

The following description of the construction and of the functions of the locking element 4 and of the blocking element 7 is provided with reference to all of FIGS. 5A to 14, which illustrate the relationship between the locking element 4 and the opening 30 in the wall of the covering shroud 3, on the one hand, and the locking element 4 and the blocking element 7, on the other hand, as well as configuration details of the locking element 4 and of the blocking element 7.

The locking element 4 has an actuating surface 5 whose outer contour is adapted to the depression 31 in the side wall of the covering shroud and allows the locking element 4 to be displaced longitudinally within the depression 31. In order for the locking element 4 to be displaced longitudinally, use is made of finger hollows 51, 52 in the actuating surface 5, between which a circular depression 50 is provided in order to accommodate an adjusting part 8 of the blocking element 7. Provided centrally within the circular depression 50 is a keyhole opening 53, through which it is possible to plug a rotary pin 9 with clamping webs 91, 92 of the blocking element 7 provided diametrically opposite one another.

The depression 50 in the actuating surface 5 of the locking element 4 has a first groove 54, 55 in the form of part of a circle and a second groove 56 in the form of part of a circle, the grooves being separated from one another by separating webs 501, 502, with the result that, between the separating webs 501, 502, the line of symmetry runs between the first and second grooves 54, 55 and 56, respectively.

Provided in the part-circle groove 54, 55 is a web 57, which divides up the groove 54, 55 into an insertion region 54 and an adjusting region 55. On the underside of the adjusting part 8 of the blocking element 7, protrusions and/or noses 81, 82 are provided opposite one another on the borders of the adjusting part 8, and are provided in one plane in relation to the clamping webs 91, 92 on the rotary pin 9 of the blocking element 7. As a result, when the blocking element 7 is inserted into the depression 50 of the actuating surface 5 of the locking element 4, on account of the alignment of the keyhole opening 53 in the depression 50 and of the corresponding assignment of the clamping webs 91, 92 of the blocking element 7, in each case one of the two noses 81, 82 engages in the insertion region 54, while the other nose engages in the part-circle groove 56.

If the adjusting surface 8 of the blocking element 7 is inserted flush into the circular recess 50 of the actuating surface 5, the clamping webs 91, 92 are located with their top end, directed toward the adjusting surface 8, somewhat beneath the keyhole opening 53. By rotation of the blocking element 7, for example with the aid of a slot 80 provided in the adjusting surface 8, the nose 81 or 82 of the blocking element 7, the nose being located in the insertion region 54, is raised by sliding along an oblique surface 570 of the web 57, wherein, as a result of the rotary movement, the clamping webs 91, 92 are no longer aligned with the keyhole opening 53 and the blocking element 7 is thus prevented from dropping out of the locking element 4.

As the rotation of the blocking element 7 continues, the relevant nose 81 or 82 springs over the web 57 and passes into the adjusting region 55. In this position, it is no longer possible for the blocking element 7 to be removed from the locking element 4 since an essentially vertical surface 571 of the web 57 prevents the blocking element 7 from being correspondingly released from the depression 50 of the locking element.

Provided within the adjustment path of the adjusting region 55 are protuberance-like elevations 58, 59 which make it possible to feel the switching movement and thus the respective end positions of the blocking element 7, in which the locking and unlocking positions are located.

The form-locking connection between the locking element and the covering shroud 3 is produced by a sliding and arresting body 6 of the locking element 4, the body, having a box-like shape and being configured as a hollow body, projecting perpendicularly from the actuating surface 5 of the locking element 4. The sliding and arresting body 6 has two side walls which butt against the lateral borders 32, 33 of the opening 30 in the covering shroud 3 and, by way of a cutout, form resilient tongues and/or movable wall sections 61, 62 on which latching protrusions 63, 64 are provided, the protrusions having oblique surfaces directed toward the bottom end of the sliding and arresting body 6 and an arresting surface projecting perpendicularly from the movable wall sections 61, 62.

When the locking element 4 is inserted into the opening 30 of the covering shroud 3, the movable wall sections 61, 62 slide along the lateral borders 32, 33 of the opening 30 and, when the latching protrusions 63, 64 are reached, are pushed into the interior of the sliding and arresting body 6 and spring back resiliently when the end of the latching protrusions 63, 64 has been reached and the inner border of the lateral opening borders 32, 33 thus butts against sliding webs 65, 66 of the movable wall sections 61, 62. With this positioning, the locking element 4 is connected to the wall section of the covering shroud 3 in the region of the opening 30 and/or of the depression 31 in a form-locking manner. This connection can be released merely by the two movable wall sections 61, 62 being simultaneously pushed into the interior of the sliding and arresting body 6.

Once the locking element 4 has been connected to the side wall of the covering shroud 3 in a form-locking manner, the locking element 4 can be displaced in the longitudinal direction within the depression or hollow 31 of the side wall of the covering shroud 3, the sliding webs 65, 66 each engaging with latching action in the notches 34, 35 of the lateral opening borders 32, 33 upon reaching an end position of the actuating surface 5 of the locking element 4 in relation to the depression or hollow 31 and/or when one of the two end edges of the sliding and arresting body 6 strikes against the corresponding end border of the opening 30.

The blocking element 7, inserted into the actuating surface 5 of the locking element 4, can be adjusted within the limits which are predetermined by the end stops of the adjusting region 55 and in which one of the two noses 81, 82 on the underside of the adjusting part 8 of the blocking element 7 strikes against the vertical surface 571 of the web 57 and/or the vertical surface which belongs to the elevation 502, and is not designated specifically.

Locking of the locking element 4 in order to block the longitudinal displacement of the same, however, is only possible when the locking position of the locking element 4 has been reached and the sliding webs 65, 66 latch into the corresponding notch 34, 35 in the lateral borders 32, 33 of the opening 30. It is only in this position that the clamping webs 81, 82 of the blocking element 7 can be pushed against the inner surfaces of the sliding and arresting body 6 to such an extent that the nose 81 or 82 overcomes the protuberance-like protrusion 59 and thus blocks the locking element 4 in the locking position.

In the same way, the unlocking position, in which the nose 81 or 82 is located between the protuberance-like elevation 58 and the vertical wall surface 571 of the web 57, can only be reached when the locking element 4 is located in a position in which the sliding webs 65, 66 latch into the correspondingly other notches 34, 35 of the lateral borders 32, 33 of the opening 30.

The actuating slot 80 in the adjusting surface 8 of the blocking element 7 may also be used to give a visual indication of the respective unlocking or locking position, the slot being aligned longitudinally in relation to the actuating surface 5 of the locking element 4 in the unlocking position and running perpendicularly thereto in the locking position.

In order to rotate the blocking element 7 it is possible to plug, for example, a coin into the actuating slot 80, with the result that no special tools are necessary for the locking, and blocking the locking, between the covering shroud 3 and the housing base 2. Instead of an actuating slot 80, use may also be made of a corresponding web projecting from the adjusting surface 8, with the result that the blocking element 7 can be rotated by the thumb and forefinger.

The invention is not restricted to the preferred exemplary embodiments specified above, because a number of variants which make use of the solution illustrated in the drawing and description, even fundamentally different types of configurations, are possible in accordance with the invention.

I claim:

1. In combination with a multi-part housing configured to accommodate electric components and electronic components, the multi-part housing having a first housing part and at least a second housing part, the first housing part having an opening formed therein and being connectable to the second housing part, the opening in the first housing part being a slot-shaped opening defining a longitudinal direction, the slot having lateral borders extending substantially parallel to one another, a device for locking the first housing part and the second housing part to one another, the device comprising:

a locking element being shaped for and disposed in the slot-shaped opening, said locking element having given parts configured to be in contact with sections of the lateral borders, said locking element being configured to be movable in the longitudinal direction between a locking position and an unlocking position;

said locking element, in the locking position, connecting the first housing part to the second housing part in at least one of a form-locking and a force-locking manner;

said locking element, in the unlocking position, releasing a connection between the first housing part and the second housing part; and a blocking element disposed in said locking element, said blocking element blocking said locking element from being adjusted at least in the locking position;

said blocking element operably disposing said given parts of said locking element into force-locking abutment against the sections of the lateral borders of the slot-shaped opening.

2. The device according to claim 1, wherein the multi-part housing is a telecommunications system housing, the first housing part is a shroud, and the second housing part is a bottom housing part.

3. The device according to claim 1, wherein:

the first housing part has an outer wall; and said locking element has an actuating surface adjacent to the outer wall of the first housing part and has a sliding and arresting body extending through the slot-shaped opening.

4. In combination with a multi-part housing configured to accommodate electric components and electronic components, the multi-part housing having a first housing part and at least a second housing part, the first housing part having an opening formed therein and an outer wall and being connectable to the second housing part, the opening in the first housing part being a slot-shaped opening defining a longitudinal direction, the slot-shaped opening having lateral borders extending substantially parallel to one another, a device for locking the first housing part and the second housing part to one another, the device comprising:

a locking element being shaped for and disposed in the slot-shaped opening, said locking element being configured to be movable between a locking position and an unlocking position, said locking element having given parts configured to be in contact with sections of the lateral borders;

said locking element having an actuating surface adjacent the outer wall of the first housing part and having a sliding and arresting body extending through the slot-shaped opening, said sliding and arresting body being a hollow body having wall sections, parts of said wall sections forming sliding elements extending parallel to and abutting against the lateral borders of the slot-shaped opening in the first housing part;

said locking element, in the locking position, connecting the first housing part to the second housing part in at least one of a form-locking and a force-locking manner;

said locking element, in the unlocking position, releasing a connection between the first housing part and the second housing part; and a blocking element connected to said locking element, said blocking element blocking said locking element from being adjusted at least in the locking position, said blocking element operably placing said given parts of said locking element into force-locking abutment against the sections of the lateral borders of the slot-shaped opening.

5. The device according to claim 4, wherein:

said wall sections of said sliding and arresting body are configured to be movable perpendicularly to the longitudinal direction; and said blocking element is disposed in said locking element and, in the locking position, operably disposes said sliding elements of said wall sections into force-locking abutment against the lateral borders of the slot-shaped opening.

6. The device according to claim 5, wherein:

said wall sections of said sliding and arresting body have latching protrusions; and said locking element is configured such that, when said sliding and arresting body is disposed in the slot-shaped opening, said wall sections and said protrusions are resiliently disposed along the lateral borders of the slot-shaped opening, said locking element is connected to the first housing part in a form-locking manner and said sliding elements butt against the lateral borders of the slot-shaped opening.

7. The device according to claim 4, wherein:

the lateral borders of the slot-shaped opening have notches formed therein; and said sliding elements are sliding webs latching into said notches of the lateral borders, if said locking element is in given positions.

8. The device according to claim 7, wherein:

said sliding webs are centrally disposed on said locking element; and the notches are disposed at the lateral borders of the slot-shaped opening, such that, in the locking position and in the unlocking position of said locking element, said sliding webs are latched in the notches.

9. The device according to claim 8, wherein:

said blocking element is a rotary locking device with an adjusting part and a rotary pin projecting perpendicularly from said adjusting part;

said adjusting part is disposed integrated in said actuating surface of said locking element; and said rotary pin has lateral clamping webs configured to abut against said wall sections of said sliding and arresting body of said locking element if said adjusting part is rotated.

10. The device according to claim 9, wherein said adjusting part is configured to be adjustable into a locking position and an unlocking position only if said sliding webs are latched into one of the notches of the lateral borders of the slot-shaped opening of the first housing part.

11. The device according to claim 3, wherein:

the first housing part has a wall section adjacent to the slot-shaped opening, the wall section has a depression formed therein; and said actuating surface of said locking element is disposed in the depression.

12. The device according to claim 9, wherein:

the actuating surface of said locking element has a depression formed therein configured to accommodate said adjusting part of said blocking element; and said adjusting part is configured as a circular disk having one of an actuating slot and an actuating web formed centrally therein.

13. The device according to claim 12, wherein said actuating surface of said locking element has a keyhole opening formed therein for accommodating said rotary pin and said lateral clamping webs of said blocking element.

14. The device according to claim 13, wherein said keyhole opening is disposed diagonally in relation to said wall sections of said sliding and arresting body of said locking element.

15. The device according to claim 14, wherein:

said adjusting part has an underside and a nose disposed on said underside, said nose is aligned with said lateral clamping webs projecting from opposite sides of said rotary pin; and said depression in said actuating surface has a groove formed therein for accommodating said adjusting part, said groove is configured as a part-circular groove and said nose engages in said groove.

16. The device according to claim 15, wherein said keyhole opening has a given depth with respect to said actuating surface, said lateral clamping webs of said blocking element are spaced from said underside of said adjusting part at least by an extent of the given depth of said keyhole opening.

17. The device according to claim 15, wherein said locking element has a web disposed in said groove, said web subdivides said groove into an insertion region arid an adjusting region for said blocking element, said insertion region is substantially aligned with said keyhole opening and is configured to accommodate said nose.

18. The device according to claim 17, wherein said web has an oblique surface directed toward said insertion region and has a vertical surface directed toward said adjusting region, said web is configured such that once said blocking element is inserted into said locking element and said web is overcome, said blocking element is adjustable by an angular extent of said adjusting region between a locking position and an unlocking position.

19. The device according to claim 18, wherein said locking element has rounded protrusions disposed in said adjusting region for setting the locking position and the unlocking position.

20. The device according to claim 15, wherein:

said adjusting part has a further nose disposed diametrically opposite from said nose on said underside;

said depression in said actuating surface has a further groove formed therein, said further groove is configured as a continuous, part-circular groove for accommodating said further nose; and said locking element has separating webs for separating said groove from said further groove.

21. The device according to claim 12, wherein said actuating surface of said locking element has finger hollows formed therein, said finger hollows are disposed adjacent to said depression accommodating said adjusting part of said blocking element.

22. A multi-part housing configuration, comprising:

a first housing part and at least a second housing part, said first housing part having an opening formed therein and being connectable to said second housing part, said opening in said first housing part being a slot-shaped opening defining a longitudinal direction, the slot-shaped opening having lateral borders extending substantially parallel to one another;

a locking element disposed in said slot-shaped opening and having given parts configured to be in contact with sections of the lateral borders, said locking element being configured to be movable in the longitudinal direction between a locking position and an unlocking position and being displaceable in the longitudinal direction between the locking position and the unlocking position;

said locking element, in the looking position, connecting said first housing part to said second housing part in at least one of a form-locking and a force-locking manner;

said looking element, in the unlocking position, releasing a connection between the first housing part and the second housing part; and a blocking element disposed in said locking element, said blocking element blocking said locking element from being adjusted at least in the locking position and operably disposing said given parts of said locking element into force-locking abutment against the sections of the lateral borders of the slot-shaped opening.

* * * * *